US011562959B2

(12) United States Patent
Foo et al.

(10) Patent No.: US 11,562,959 B2
(45) Date of Patent: Jan. 24, 2023

(54) EMBEDDED DUAL-SIDED INTERCONNECT BRIDGES FOR INTEGRATED-CIRCUIT PACKAGES

(71) Applicant: Intel Corporation, Santa Clara, CA (US)

(72) Inventors: Loke Yip Foo, Bayan Baru (MY); Teong Guan Yew, Bagan Serai (MY); Choong Kooi Chee, Penang (MY)

(73) Assignee: Intel Corporation, Santa Clara, CA (US)

( * ) Notice: Subject to any disclaimer, the term of this patent is extended or adjusted under 35 U.S.C. 154(b) by 23 days.

(21) Appl. No.: 16/912,638

(22) Filed: Jun. 25, 2020

(65) Prior Publication Data

US 2021/0098375 A1 Apr. 1, 2021

(30) Foreign Application Priority Data

Sep. 27, 2019 (MY) .............................. PI2019005709

(51) Int. Cl.
*H01L 23/528* (2006.01)
*H01L 21/768* (2006.01)
*H01L 23/532* (2006.01)
*H01L 23/522* (2006.01)

(52) U.S. Cl.
CPC .... *H01L 23/5286* (2013.01); *H01L 21/76877* (2013.01); *H01L 23/5226* (2013.01); *H01L 23/5329* (2013.01)

(58) Field of Classification Search
CPC ............. H01L 23/5385; H01L 23/5386; H01L 23/5286; H01L 25/0655; H01L 23/5226; H01L 23/5329; H01L 21/7687
See application file for complete search history.

(56) References Cited

U.S. PATENT DOCUMENTS

| 11,335,641 B2* | 5/2022 | Aleksov ................... H01L 23/13 |
| 11,335,663 B2* | 5/2022 | Liff .......................... H01L 25/18 |
| 2019/0206792 A1* | 7/2019 | Collins ................... H01L 25/18 |
| 2019/0371734 A1* | 12/2019 | Chang ...................... H01L 24/83 |
| 2020/0227386 A1* | 7/2020 | Kim ....................... H01L 25/105 |
| 2020/0364600 A1* | 11/2020 | Elsherbini ............. H01L 21/486 |
| 2021/0057352 A1* | 2/2021 | Agarwal ............. H01L 23/5389 |
| 2021/0183779 A1* | 6/2021 | Cheah ............... H01L 23/49838 |
| 2022/0068814 A1* | 3/2022 | Kim .................... H01L 23/5386 |

* cited by examiner

*Primary Examiner* — Jaehwan Oh
*Assistant Examiner* — John M Parker
(74) *Attorney, Agent, or Firm* — Schwegman Lundberg & Woessner, P.A.

(57) ABSTRACT

A dual-sided embedded multi-die interconnect bridge provides power and source conduits from the bridge bottom at a silicon portion, in short paths to dice on a die side of an integrated-circuit package substrate. Signal traces are in a metallization on the silicon portion of the dual-sided EMIB. Power, ground and signal vias all emanate from the dual-sided embedded multi-die interconnect bridge, with power and ground entering the bridge from central regions of the silicon portion.

17 Claims, 9 Drawing Sheets

EMBEDDED DUAL-SIDED INTERCONNECT BRIDGES FOR INTEGRATED-CIRCUIT PACKAGES

PRIORITY APPLICATION

This application claims the benefit of priority to Malaysian Application Serial Number P12019005709, filed Sep. 27, 2019, which is incorporated herein by reference in its entirety.

FIELD

This disclosure relates to die-to-die interconnects for integrated-circuit device packages.

BACKGROUND

Integration of multiple integrated-circuit chips within a package, has real-estate limitations where interconnect bridges are employed, and power delivery is affected by the location of the interconnect bridge.

BRIEF DESCRIPTION OF THE DRAWINGS

Disclosed embodiments are illustrated by way of example, and not by way of limitation, in the figures of the accompanying drawings where like reference numerals may refer to similar elements, in which.

DETAILED DESCRIPTION

A modular dual-sided interconnect bridge provides power-delivery network performance by bringing a power-delivery through a silicon portion of the bridge, from the bottom, and provides a shortened path of power delivery to mother and daughter dice for which the interconnect bridge is outfitted.

A through-silicon metal track is brought through the silicon portion of the interconnect bridge, and the power-delivery path is continued, mostly vertically, through a metallization that is assembled on the silicon portion. It is be understood that "silicon" with respect to a dual-sided embedded multi-chip interconnect bridge, means a semiconductive material that may be silicon, or doped silicon. The term "silicon" with respect to dual-sided embedded multi-chip interconnect bridge may mean a material such as a III-V material that is amenable to photolithography processing. The term "silicon" with respect to a dual-sided embedded multi-chip interconnect bridge may mean a semiconductive carbon nano-structure material that is amenable to photolithography processing. Other materials such as doped silica glasses may be referred to as "silicon" with respect to a silicon portion of a dual-sided embedded multi-chip interconnect bridge, where the doped silica glass is amenable to photolithography processing.

Figure 1:
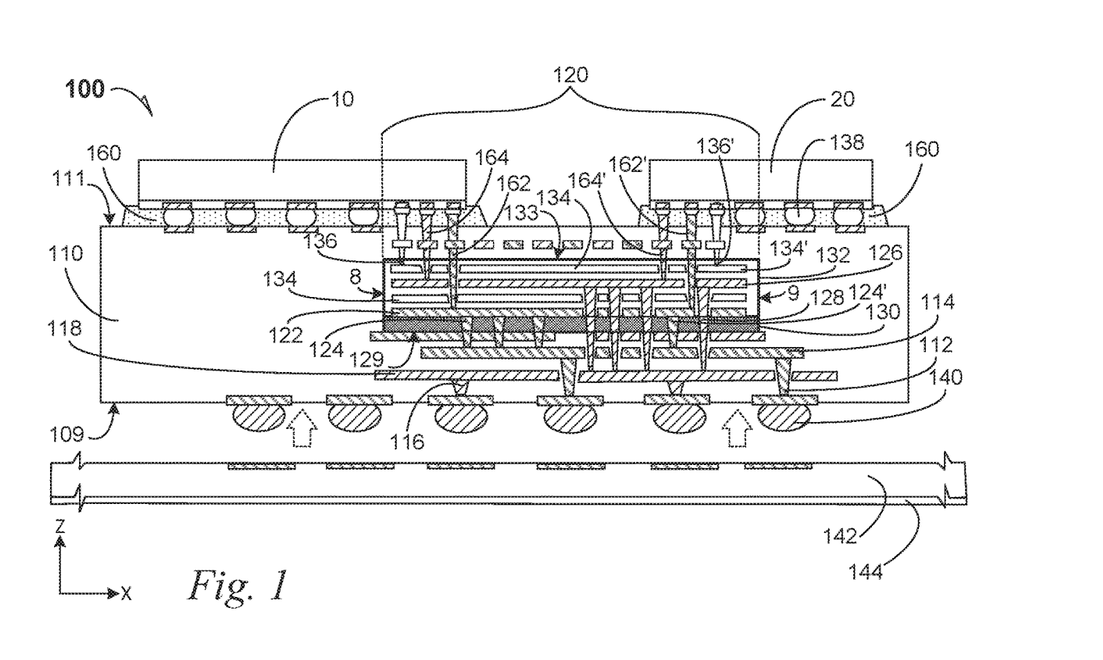
FIG. 1 is a cross-section elevation of an embedded multi-chip interconnect bridge in an integrated-circuit package according to several embodiments.

FIG. 1 is a cross-section elevation of an embedded multi-chip interconnect bridge (EMIB) in an integrated-circuit package 100 according to several embodiments. An integrated-circuit package substrate 110 includes a die side 111 and an land side 109. Details of vias and traces within the IC package substrate 110 are limited to structures such as power-delivery vias 112 and power-delivery rails 114, and source-return vias 116 and source-collector rails 118. The several delineated structures 112, 114, 116 and 118, support a dual-sided multi-die interconnect bridge (DS EMIB) 120 that is at least partially embedded in the IC package substrate 110.

The dual-sided EMIB 120 includes a silicon section 130 and a metallization section 132. The silicon section 130 is made from semiconductive material such as doped or undoped silicon, or another material such as a III-V combination such as gallium arsenide. Further discussion discloses processing of the silicon section 130, followed by processing of the metallization section 132.

The dual-sided EMIB 120 has edge boundaries 8 and 9 that both the silicon section 130 and the metallization section 132 share after complete assembly. The metallization portion 132 has a die side 133 that is the upper boundary of the dual-sided EMIB 120, and the silicon portion 130 had a land side 129, that is the lower boundary of the dual-sided EMIB 120.

Where a via passes through the silicon section 130, it is referred to as a silicon metal track. For example, a power-delivery 124 is a power-delivery through-silicon metal track 124 as it is formed passing through the silicon section 130 of the dual-sided interconnect bridge 120. Similarly for example, a ground-return via 128 is a ground-return through-silicon metal track 128 as it is formed passing through the silicon section 130. A trace within a silicon section of a dual-sided interconnect bridge, if present, may also be referred to as a track.

Figure 1A:
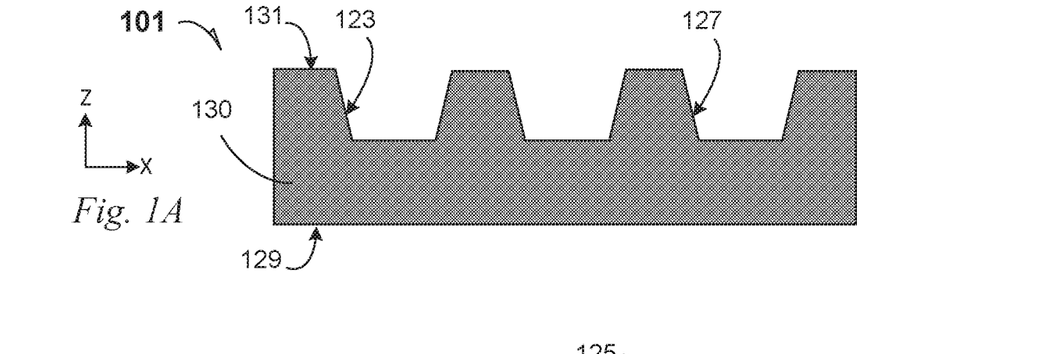
FIG. 1A is a cross-section elevation of the silicon portion of the dual-sided embedded multi-chip interconnect bridge (see FIG. 1) during assembly according to several embodiments.
Figure 1B:
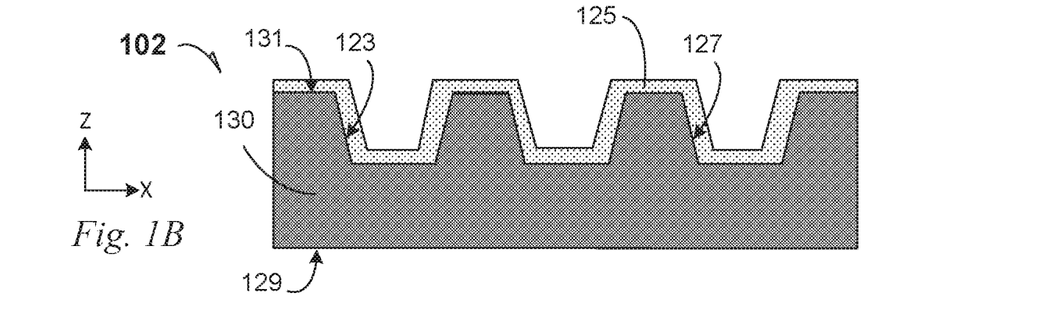
FIG. 1B is a cross-section elevation of the silicon portion depicted in FIG. 1A after further processing according to an embodiment.

In an embodiment, within the DS EMIB 120, power (Vcc) planes 122 and power vias 124 are depicted, where the power-delivery through-silicon metal tracks 124 are fabricated using semiconductor processing techniques, including via etching and dielectric film formation such as a nitride material (see e.g. FIG. 1B). Further contained within the silicon section 130 and the metallization section 132 are ground (Vss) planes 126 and ground-return through-silicon metal tracks 128. Further contained within the metallization section 132 are signal traces 134 and signal vias 136. The signal traces 134 and signal vias (first signal via 136 and subsequent signal via 136') are only found in the metallization section 132, and they provide high-density I/O communication between the IC dice 10 and 20, such as a mother IC die 10 like a logic processor, and a daughter die 20 like a memory die. As illustrated, the respective first and subsequent signal vias 136 and 136' each emanate from the dual-sided EMIB 120, to make contact to the respective first and subsequent IC dice 10 and 20.

In an embodiment where the two IC dice 10 and 20 may operate at different potentials, such as 1.0 V for the first IC die 10 and 1.5 V for the subsequent IC die 20, the signal traces may be differentiated as first signal traces 134 and subsequent signal traces 134'. In an embodiment, the two signal vias 136 and 136' each contact the same signal trace.

It can be seen that the power-delivery through-silicon metal track 124 passes through the silicon portion 130 at a land side, as well as the ground-return through-silicon metal track 128, that each via is found between the edge boundaries 8 and 9 and that they are spaced apart from each other.

In an embodiment, where two IC dice 10 and 20 may operate at different potentials, such as 1.0 V for the first IC die 10 and 1.5 V for the subsequent IC die 20, the power-delivery vias may be differentiated as a first power-delivery through-silicon metal track 124 and a subsequent power-delivery through-silicon metal track 124'. In an embodiment, the two power-delivery through-silicon metal tracks 124 and 124' each contact the same power plane 122 at a single potential.

In an embodiment, interconnection between the at least two IC dice 10 and 20 and structures beyond the IC package substrate 110, include micro bumps 138 to contact the IC dice 10 and 20 to the die side 111. Solder-resist layers 160 allow power vias 162 and ground vias 164 to couple the IC dice 10 and 20 to the bottom of the silicon portion 130, as well as to power being delivered at the land side 109. Where the DS EMIB 120 is assembled in the IC package substrate, the die-side power-delivery vias may be delineated as a power-delivery via 162 in a first-die region (referring to the location of the first IC die 10), and a power-delivery via 162' in a subsequent-die region (referring to the location of the subsequent IC die 20). Similarly, ground-return vias 164 and 164' refer to their locations in respective first-die and subsequent-die regions. Similarly, the first and subsequent signal vias 136 and 136' may be described as a first signal via 136 in a first-die region, and a subsequent signal via 136' is a subsequent-die region.

In an embodiment, land-side bumps 140 to contact the IC package substrate 110 to a board 142 such as a printed wiring board 142. In an embodiment, an external shell 144 is an integral part of the printed wiring board 142, and the external shell 144 is a dielectric material that provides both electrically insulative and physical protection for components mounted on the PWB 142. In an embodiment, the PWB 142 and the external shell 144 are part of the exterior of an apparatus such as a mobile computing system. In an embodiment, the PWB 142 and the external shell 144 are part of the exterior of an apparatus such as a drone.

FIG. 1A is a cross-section elevation 101 of the silicon portion 130 of the DS EMIB 120 (see FIG. 1) during assembly according to several embodiments. Details not rendered in FIG. 1, are set forth in FIGS. 1A through 1F, 2A through 2C, and 3A through 3C.

In an embodiment, the silicon portion 130 includes a land side 129 and a metallization side 131, and power-via through-silicon corridors 123 for eventual power-delivery through-silicon metal tracks 124 (see FIG. 1), and ground via through-silicon corridors 127 for eventual ground-return metal through-silicon metal tracks 128 (see FIG. 1) have been etched into the metallization side 131.

FIG. 1B is a cross-section elevation 102 of the silicon portion 130 depicted in FIG. 1A after further processing according to an embodiment. A dielectric film 125 is formed in the several through-silicon via corridors 123 and 127, such as a silicon nitride film 125 that is formed by conventional technique that nitride-reacts exposed surfaces of the silicon portion according to several embodiments. In a non-limiting example embodiment, a nitride vapor anneal is done to form the dielectric film 125.

Figure 1C:
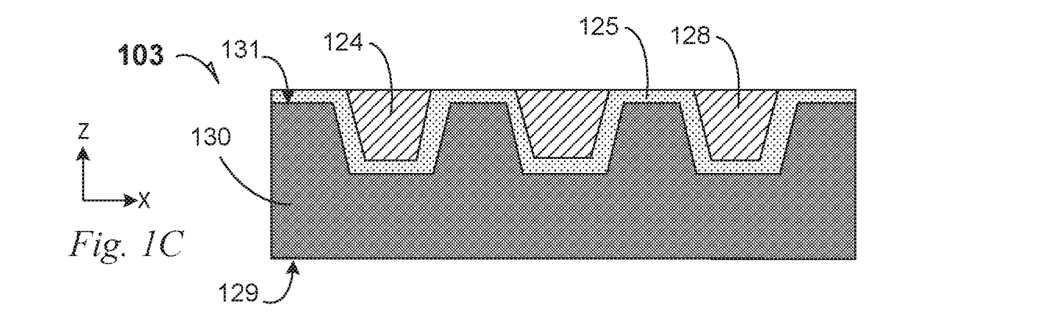
FIG. 1C is a cross-section elevation of the silicon portion depicted in FIG. 1B after further processing according to an embodiment.

FIG. 1C is a cross-section elevation 103 of the silicon portion 130 depicted in FIG. 1B after further processing according to an embodiment. A power-delivery through-silicon metal track 124 and a ground-return through-silicon metal track 128 have been deposited in the respective power and ground through-silicon via corridors. In an embodiment, the several through-silicon metal tracks 124 and 128 are an electronics-grade copper (Cu) material that is deposited onto the dielectric film 125.

Figure 1D:
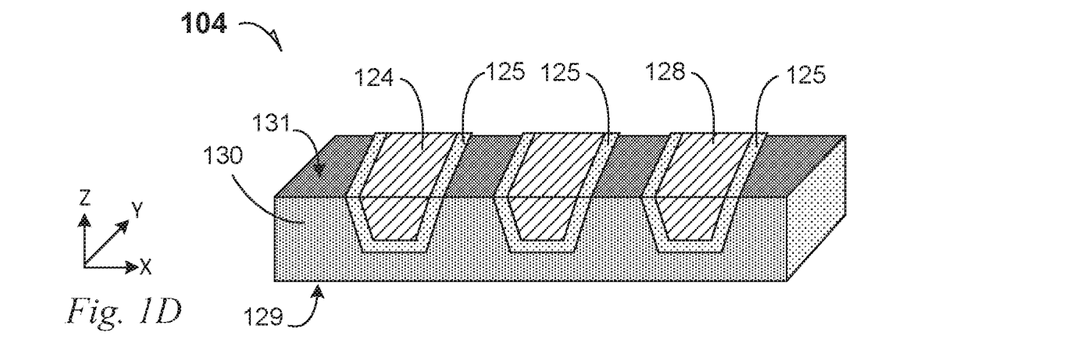
FIG. 1D is perspective elevation of the silicon portion depicted in FIG. 1C after further processing according to an embodiment.

FIG. 1D is perspective elevation 104 of the silicon portion 130 depicted in FIG. 1C after further processing according to an embodiment. In an embodiment, some polishing or grinding is done to restore exposure of the die side of the silicon portion 130. As depicted in a non-limiting embodiment, the power-delivery through-silicon metal track 124 has a "copper bar" form factor within the power-via through-silicon corridor and upon the dielectric film 125, although the power-delivery through-silicon metal track 124 may have symmetrical X-Y form factor. Similarly in a non-limiting embodiment, the ground-return through-silicon metal track 128 has a copper bar form factor within the ground-via through-silicon corridor and upon the dielectric film 125, although the ground-delivery through-silicon metal track 128 may have symmetrical X-Y form factor.

Figure 1E:
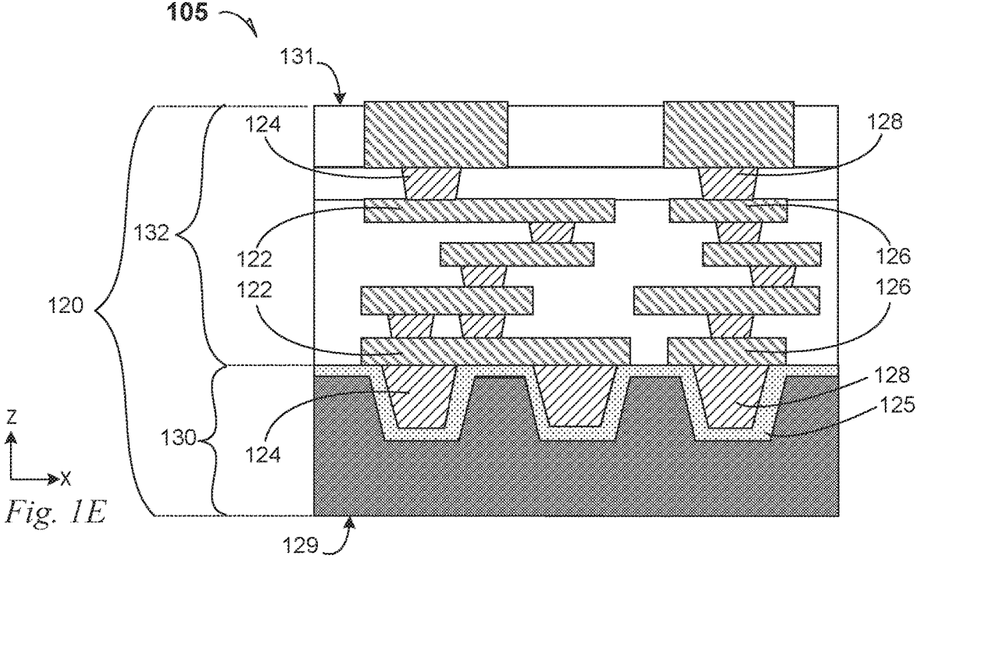
FIG. 1E is cross-section elevation of a subsection of a dual-sided embedded multi-die interconnect bridge after further processing of the silicon portion including the metallization portion.

FIG. 1E is cross-section elevation of a subsection of a dual-sided embedded multi-die interconnect bridge 105 after further processing of the silicon portion 130 including the metallization portion 132. In an embodiment, several layers of metallization and dielectric materials, make up the metallization portion 132, with power planes 122 and power-delivery through-silicon metal tracks 124 that provide bottom-to-top power conduits through the DS EMIB 120.

Similarly in an embodiment, several layers of metallization and dielectric materials, make up the metallization portion 132, with ground planes 126 and ground-return through-silicon metal tracks 128 that provide bottom-to-top Vss conduits through the DS EMIB 120. The metallization portion 132 has a die side 133 that is the upper boundary of the dual-sided EMIB 120, and the silicon portion 130 had a land side 129, that is the lower boundary of the dual-sided EMIB 120.

Figure 1F:
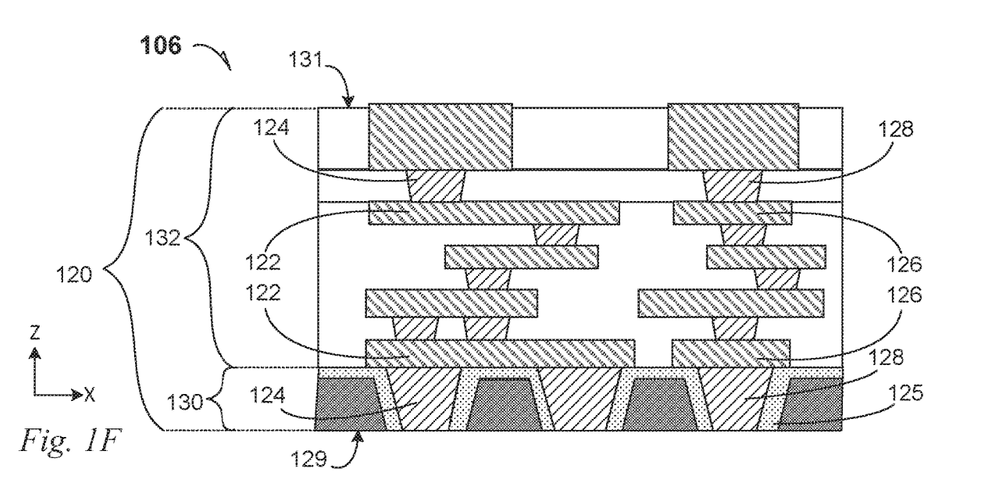
FIG. 1F is cross-section elevation of the subsection of a dual-sided embedded multi-die interconnect bridge, depicted in FIG. 1E after further processing according to an embodiment.

FIG. 1F is cross-section elevation of the subsection of a dual-sided embedded multi-die interconnect bridge 105, depicted in FIG. 1E after further processing according to an embodiment. The subsection 106 of the DS EMIG 120 has been thinned at the silicon portion 130, such that the die side 129 has moved to expose the respective power-delivery and ground-return through-silicon metal tracks 124 and 128. In an embodiment, several layers of metallization and dielectric materials, make up the metallization portion 132, with power planes 122 and power-delivery through-silicon metal tracs 124 that provide bottom-to-top power conduits through the DS EMIB 120. In an embodiment, the power-delivery through-silicon metal tracks may be delineated as a land-side power-delivery through-silicon metal track 124 and a subsequent land-side power-delivery through-silicon metal track 124'.

Although signal traces only track from the mother die 10 to the daughter die 20 (see FIG. 1), power and ground are routed directly from the bottom of the silicon portion 130 for useful short-path power delivery to the several dice 10 and 20.

Figure 2A:
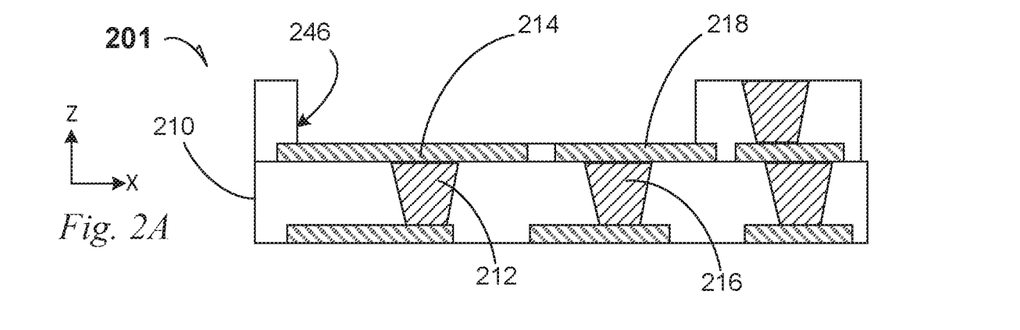
FIG. 2A is a cross-section elevation of a portion of an integrated-circuit package substrate during assembly with a dual-sided embedded multi-die interconnect bridge according to an embodiment.

FIG. 2A is a cross-section elevation 201 of a portion of an integrated-circuit package substrate during assembly with a dual-sided embedded multi-die interconnect bridge according to an embodiment. An integrated-circuit package substrate 210 is being assembled with a cavity opening 246 to receive a DS EMIB according to an embodiment. During assembly of the IC package substrate 210, a power-delivery via 212 and a ground, or source-return via 216 are formed to communicate to the cavity opening 246 in preparation for seating a DS EMIB and coupling DS EMIB to a power-delivery rail 214 and to a source-return rail 216 according to several embodiments.

Figure 2B:
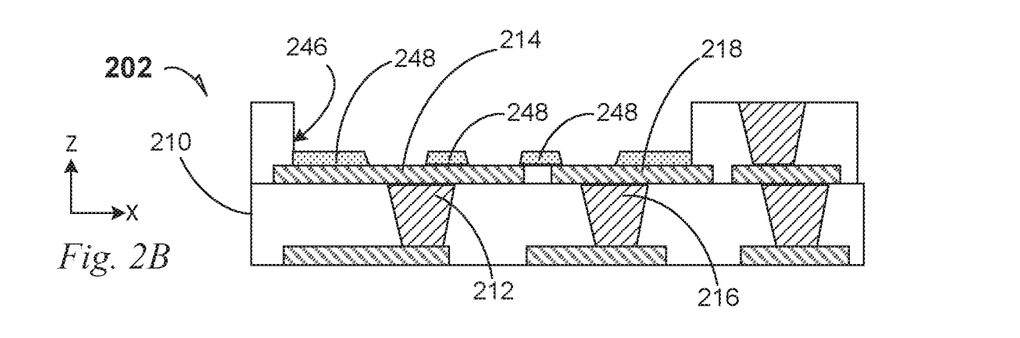
FIG. 2B is a cross-section elevation of a portion of the IC package substrate depicted in FIG. 2A after further assembly according to an embodiment.

FIG. 2B is a cross-section elevation 202 of a portion of the IC package substrate 201 depicted in FIG. 2A after further assembly according to an embodiment. An adhesive dielectric 248 such as an adhesive polymer 248 is patterned within the cavity opening 246, such that bond pad openings are exposed. As depicted, two openings expose the power-delivery rail 214 for increased current flow, and a single opening exposes the source-return rail 218.

Figure 2C:
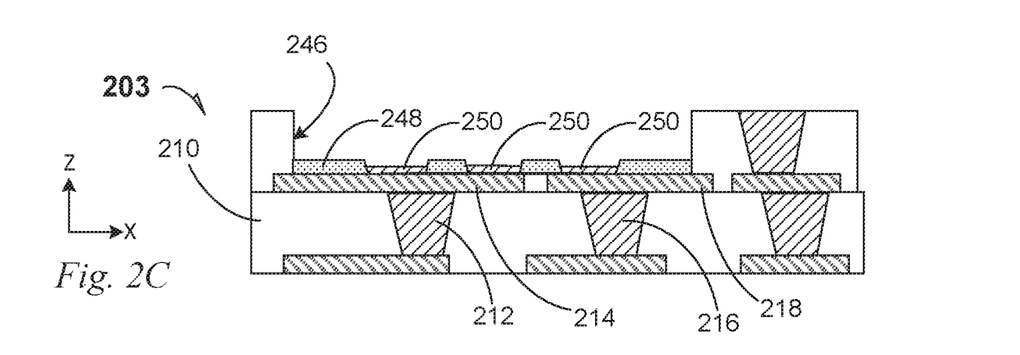
FIG. 2C is a cross-section elevation of a portion of the IC package substrate depicted in FIG. 2B after further assembly according to an embodiment.

FIG. 2C is a cross-section elevation 203 of a portion of the IC package substrate 202 depicted in FIG. 2B after further assembly according to an embodiment. A solder film 250 is seated in each bond pad opening between the adhesive dielectric 248, in preparation for seating a DS EMIB according to an embodiment. As depicted, the solder films cover openings that access the power-delivery rail 214 for increased current flow, and solder film on the single opening exposes the source-return rail 218.

Figure 3A:
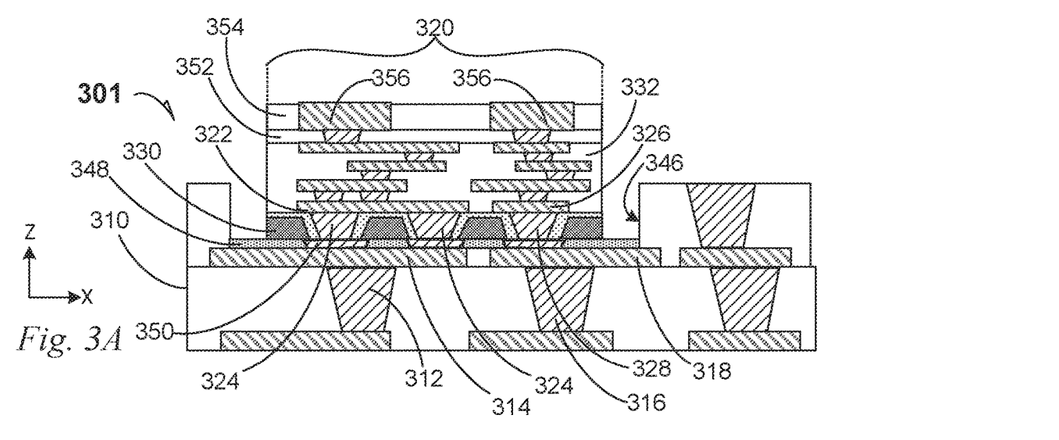
FIG. 3A is a cross-section elevation of a dual-sided embedded multi-die interconnect bridge during assembly into an integrated-circuit package substrate according to an embodiment.

FIG. 3A is a cross-section elevation of a dual-sided embedded multi-die interconnect bridge during assembly into an integrated-circuit package substrate according to an embodiment. A DS EMIB 320 is seated onto an adhesive polymer 348 and a patterned solder film 350 in a cavity opening 346 of an IC package substrate 310. A silicon portion 330 supports two power-delivery through-silicon metal tracks 324, which are coupled to a power-delivery via 312 in the IC package substrate 310. A metallization portion 332 supports other power-delivery and source-return vias and traces.

The dual-sided EMIB 320 makes contact with a power plane 314 in the IC package substrate 310. Similarly, the silicon portion 330 of the DS EMIB 320 supports a source-return through-silicon metal track 328, which is coupled to a source-return via 316 in the IC package substrate 310. The dual-sided EMIB 320 also makes contact with a ground plane 318 in the IC package substrate 310.

Other structures in the dual-sided EMIB 320 include a passivation layer 352, and a patterned solder-resist layer 354 to accommodate electrical bumps 356, according to several embodiments. Again, I/O traces and electrical bumps are not depicted in FIG. 3A, as a focus is on power and ground conduits being directed from the silicon portion, and to the solder bumps 356 for coupling to die-side integrated-circuit dice.

Figure 3B:
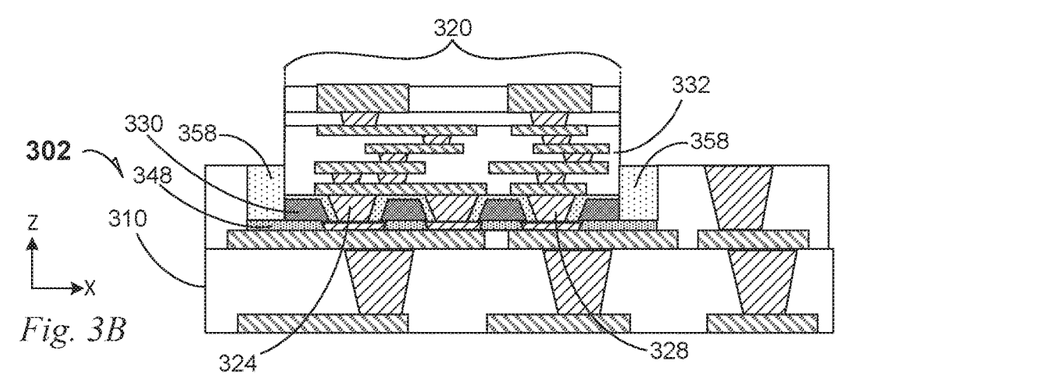
FIG. 3B is a cross-section elevation of the IC package depicted in FIG. 3A after further processing according to an embodiment.

FIG. 3B is a cross-section elevation of the IC package 301 depicted in FIG. 3A after further processing according to an embodiment. The IC package 302 to backfill the cavity opening 346 (see FIG. 3A) with spacer material 358 disposed on exposed portions of the adhesive polymer 348, in preparation for completing a dual-sided EMIB in an IC package substrate.

Figure 3C:
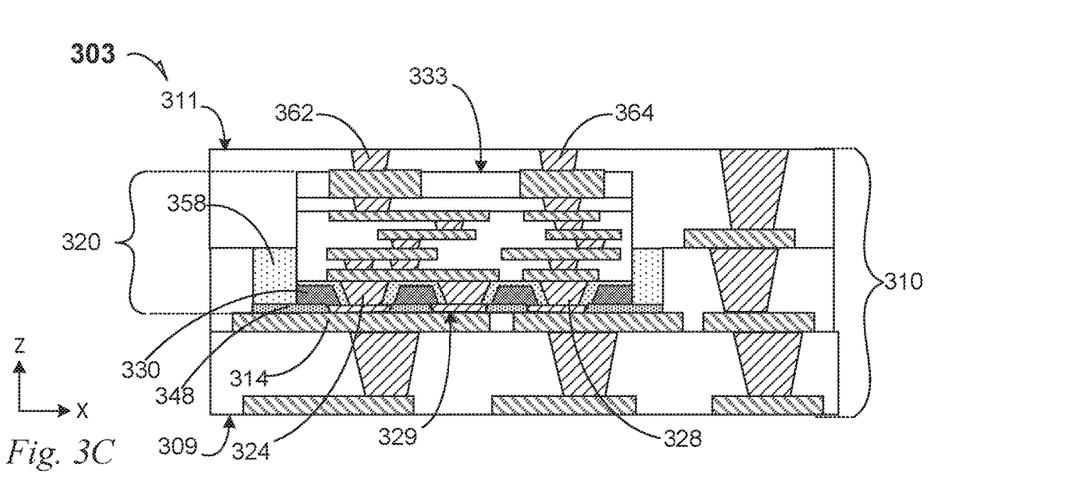
FIG. 3C is a cross-section elevation of the IC package depicted in FIG. 3B after further processing according to an embodiment.

FIG. 3C is a cross-section elevation of the IC package 302 depicted in FIG. 3B after further processing according to an embodiment. The IC package substrate 310 is essentially completed with a power via 362 and a ground via 364 to couple the IC dice (not pictured) at a die side 311, to the bottom of the silicon portion 330, as well as to power being delivered at a land side 309. Although not illustrated, the dual-sided EMIB 320 includes I/O traces such the signal traces 134 and 134' depicted in FIG. 1. By contrast to the through-silicon metal tracks 324 and 328, which facilitate center-positioned, landside portion 329 bridge entry at the silicon portion 330, of respective power and ground conduits, the signal traces are coupled by signal vias that enter and exit at the bride die side 333. (In FIG. 1, see signal traces 134 and 134' and coupling signal vias 136 and 136'). The respective power-delivery and ground-return conduits enter the dual-sided EMIB 320 from the landside portion 329 at 234 and 328, respectively, and are available to couple to a die at the respective power and ground vias 362 and 364.

The dual-sided EMIB 320 makes contact with a power plane 314 in the IC package substrate 310. Similarly, the silicon portion 330 of the DS EMIB 320 supports a source-return through-silicon metal track 328.

Figure 3D:
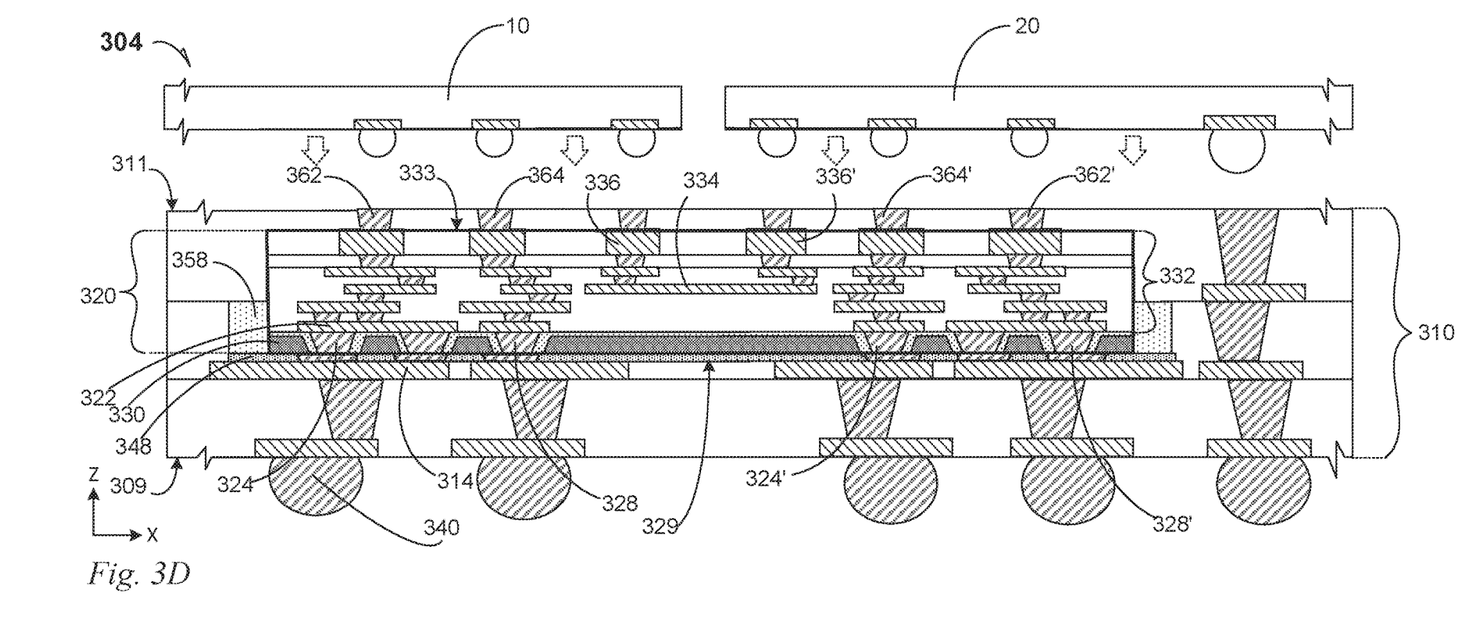
FIG. 3D is a cross-section elevation of an IC package with a dual-sided embedded multi-die interconnect bridge, that expands details of the IC package depicted in FIG. 3C according to several embodiments.

FIG. 3D is a cross-section elevation of an IC package 304 with a dual-sided embedded multi-die interconnect bridge 320, that expands details of the IC package 303 depicted in FIG. 3C according to several embodiments.

The IC package substrate 310 is essentially completed with power and ground vias 362 and 364 for a first IC die 10, and with power and ground vias 362' and 364' for a subsequent IC die 20 according to an embodiment. The first and subsequent dice 10 and 20 are depicted being brought to seat on the die side 311 of the IC package substrate 310.

The first and subsequent IC dice 10 and 20 receive power and ground from the bottom of the silicon portion 330, as well as to power being delivered at a land side 309 such as through an electrical bump 340.

The dual-sided EMIB 320 includes I/O traces 334 that are coupled into an out of the DS EMIB 320 by coupling signal vias 336 and 336'. By contrast to the through-silicon metal tracks 324 and 328 and 324' and 328', which facilitate center-positioned, landside portion 329 bridge entry at the silicon portion 330, of respective power and ground conduits, the signal traces 334 are coupled by signal vias that enter and exit at the bride die side 333.

The dual-sided EMIB 320 makes contact with a power plane 314 in the IC package substrate 310. Additionally, a power (Vcc) plane 322 is located at the interface between the silicon portion 330 and the metallization section 332.

Figure 4:
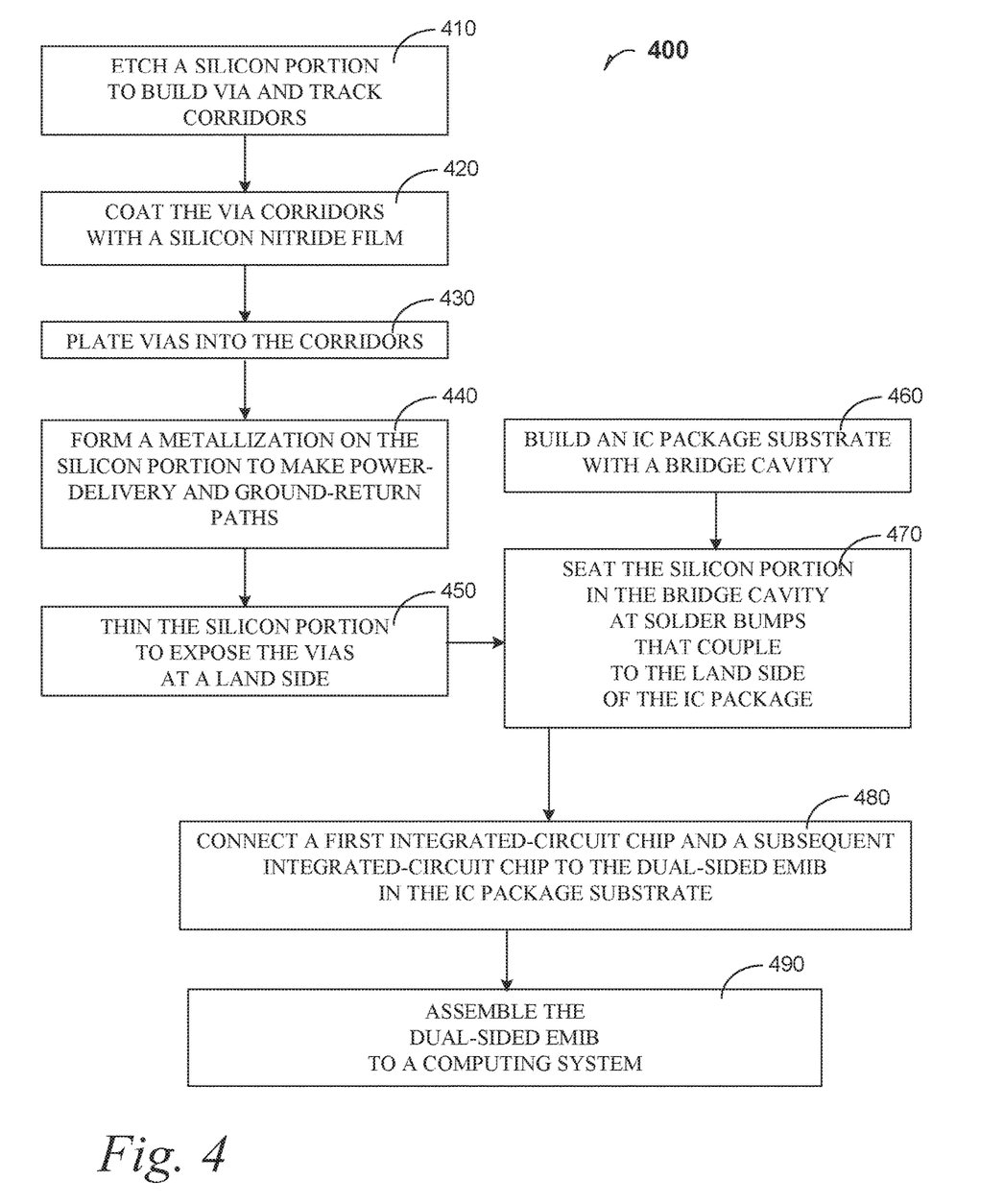
FIG. 4 is a process flow diagram according to several embodiments.

FIG. 4 is a process flow diagram according to several embodiments.

At 410, the process includes etching a silicon portion of a bridge to build via and track corridors.

At 420, the process includes coating the via and track corridors with a dielectric such as a silicon nitride film.

At 430, the process includes plating vias and traces into the via and track corridors, respectively, At 440, the process includes forming a metallization layer above the silicon portion to make power-delivery and ground-return paths in the bridge.

At 450, the process includes thinning the silicon portion to expose the vias at a land side of the silicon bridge.

At 460, the process includes forming an IC package substrate with a bridge cavity.

At 470, the process includes seating the silicon portion in the bridge cavity at solder bumps that couple to the land side of the IC package substrate.

At 480, the process includes seating first IC die and a subsequent IC die on a land side of the IC package substrate, to couple power-delivery and ground-return paths from the land side of the silicon bridge to the IC dice, and to the land side of the IC package substrate.

At 490 the process includes assembling the dual-sided EMIB bridge-containing IC package to a computing system.

Figure 5:
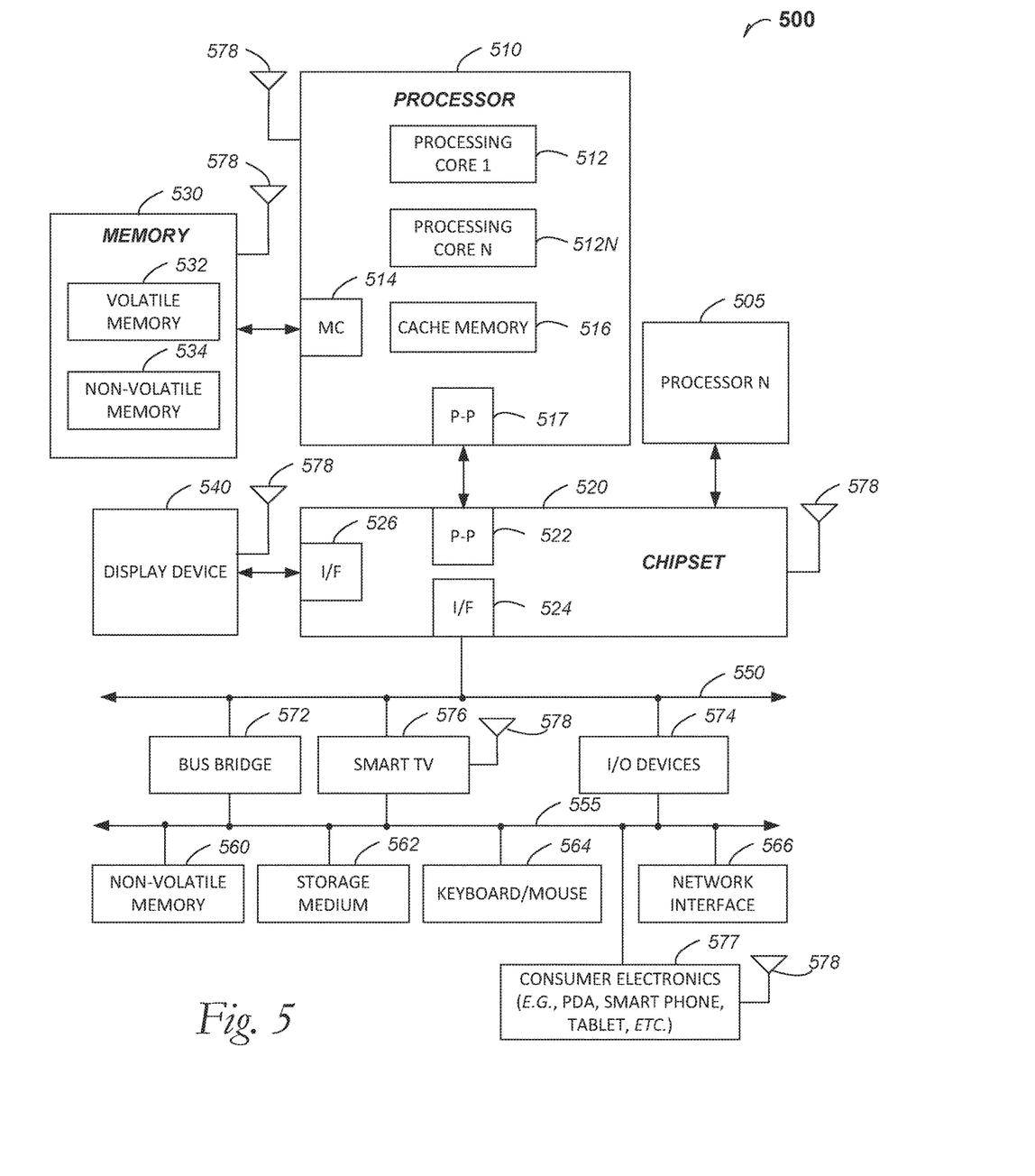
FIG. 5 is included to show an example of a higher-level device application for the disclosed embodiments.

FIG. 5 is included to show an example of a higher-level device application for the disclosed embodiments. The dual-sided EMIB bridge-containing IC package embodiments may be found in several parts of a computing system. In an embodiment, the dual-sided EMIB bridge-containing IC package embodiments can be part of a communications apparatus such as is affixed to a cellular communications tower. In an embodiment, a computing system 500 includes, but is not limited to, a desktop computer. In an embodiment, a computing system 500 includes, but is not limited to a laptop computer. In an embodiment, a computing system 500 includes, but is not limited to a tablet. In an embodiment, a computing system 500 includes, but is not limited to a notebook computer. In an embodiment, a computing system 500 includes, but is not limited to a personal digital assistant (PDA). In an embodiment, a computing system 500 includes, but is not limited to a server. In an embodiment, a computing system 500 includes, but is not limited to a workstation. In an embodiment, a computing system 500 includes, but is not limited to a cellular telephone. In an embodiment, a computing system 500 includes, but is not limited to a mobile computing device. In an embodiment, a computing system 500 includes, but is not limited to a smart phone. In an embodiment, a system 500 includes, but is not limited to an internet appliance. Other types of computing devices may be configured with the microelectronic device that includes dual-sided EMIB bridge-containing IC package embodiments.

In an embodiment, the processor 510 has one or more processing cores 512 and 512N, where 512N represents the Nth processor core inside processor 510 where N is a positive integer. In an embodiment, the electronic device system 500 using a dual-sided EMIB bridge-containing IC package embodiment that includes multiple processors including 510 and 505, where the processor 505 has logic similar or identical to the logic of the processor 510. In an embodiment, the processing core 512 includes, but is not limited to, pre-fetch logic to fetch instructions, decode logic to decode the instructions, execution logic to execute instructions and the like. In an embodiment, the processor 510 has a cache memory 516 to cache at least one of instructions and data for the dual-sided EMIB bridge-containing IC package element on an integrated-circuit package substrate in the system 500. The cache memory 516 may be organized into a hierarchal structure including one or more levels of cache memory.

In an embodiment, the processor 510 includes a memory controller 514, which is operable to perform functions that enable the processor 510 to access and communicate with memory 530 that includes at least one of a volatile memory 532 and a non-volatile memory 534. In an embodiment, the processor 510 is coupled with memory 530 and chipset 520. In an embodiment, the chipset 520 is part of a dual-sided EMIB bridge-containing IC package embodiment depicted, e.g. in FIGS. 1, and 3C.

The processor 510 may also be coupled to a wireless antenna 578 to communicate with any device configured to at least one of transmit and receive wireless signals. In an embodiment, the wireless antenna interface 578 operates in accordance with, but is not limited to, the IEEE 802.11 standard and its related family, Home Plug AV (HPAV), Ultra Wide Band (UWB), Bluetooth, WiMax, or any form of wireless communication protocol.

In an embodiment, the volatile memory 532 includes, but is not limited to, Synchronous Dynamic Random-Access Memory (SDRAM), Dynamic Random-Access Memory (DRAM), RAMBUS Dynamic Random-Access Memory (RDRAM), and/or any other type of random access memory device. The non-volatile memory 534 includes, but is not limited to, flash memory, phase change memory (PCM), read-only memory (ROM), electrically erasable programmable read-only memory (EEPROM), or any other type of non-volatile memory device.

The memory 530 stores information and instructions to be executed by the processor 510. In an embodiment, the memory 530 may also store temporary variables or other intermediate information while the processor 510 is executing instructions. In the illustrated embodiment, the chipset 520 connects with processor 510 via Point-to-Point (PtP or P-P) interfaces 517 and 522. Either of these PtP embodiments may be achieved using a dual-sided EMIB bridge-containing IC package embodiment as set forth in this disclosure. The chipset 520 enables the processor 510 to connect to other elements in a dual-sided EMIB bridge-containing IC package embodiment in a system 500. In an embodiment, interfaces 517 and 522 operate in accordance with a PtP communication protocol such as the Intel® QuickPath Interconnect (QPI) or the like. In other embodiments, a different interconnect may be used.

In an embodiment, the chipset 520 is operable to communicate with the processor 510, 505N, the display device 540, and other devices 572, 576, 574, 560, 562, 564, 566, 577, etc. The chipset 520 may also be coupled to a wireless antenna 578 to communicate with any device configured to at least do one of transmit and receive wireless signals.

The chipset 520 connects to the display device 540 via the interface 526. The display 540 may be, for example, a liquid crystal display (LCD), a plasma display, cathode ray tube (CRT) display, or any other form of visual display device. In an embodiment, the processor 510 and the chipset 520 are merged into a dual-sided EMIB bridge-containing IC package embodiment in a system. Additionally, the chipset 520 connects to one or more buses 550 and 555 that interconnect various elements 574, 560, 562, 564, and 566. Buses 550 and 555 may be interconnected together via a bus bridge 572 such as at least one dual-sided EMIB bridge-containing IC package embodiment. In an embodiment, the chipset 520, via interface 524, couples with a non-volatile memory 560, a mass storage device(s) 562, a keyboard/mouse 564, a network interface 566, smart TV 576, and the consumer electronics 577, etc.

In an embodiment, the mass storage device 562 includes, but is not limited to, a solid-state drive, a hard disk drive, a universal serial bus flash memory drive, or any other form of computer data storage medium. In one embodiment, the network interface 566 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 5 are depicted as separate blocks within the dual-sided EMIB bridge-containing IC package embodiments in a computing system 500, the functions performed by some of these blocks may be integrated within a single semiconductor circuit or may be implemented using two or more separate integrated circuits. For example, although cache memory 516 is depicted as a separate block within processor 510, cache memory 516 (or selected aspects of 516) can be incorporated into the processor core 512.

Figure 6:
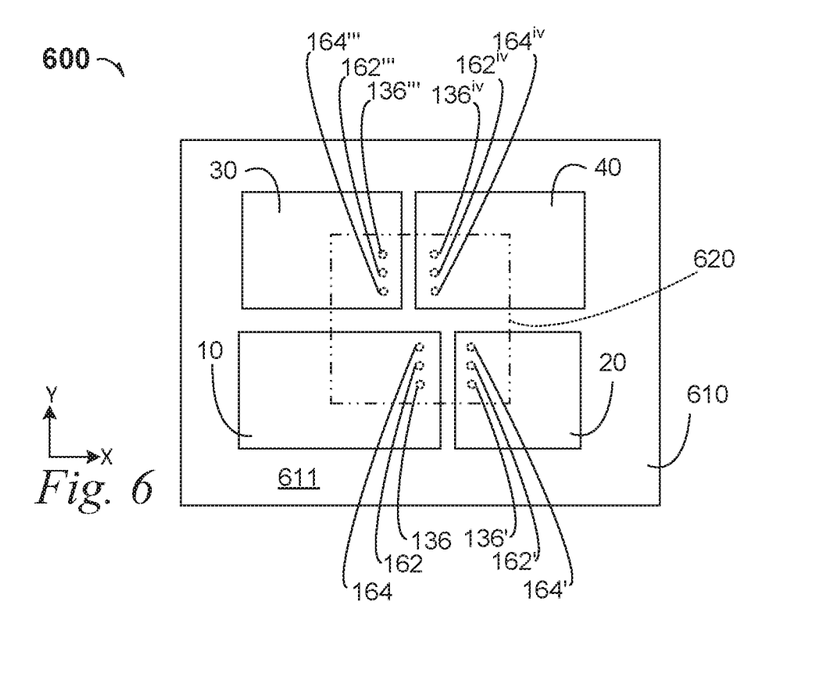
FIG. 6 is a top plan of an integrated-circuit package that includes a dual-sided embedded multi-die interconnect bridge according to several embodiments.

FIG. 6 is a top plan of an integrated-circuit package that includes a dual-sided embedded multi-die interconnect bridge according to several embodiments.

A die side 611 of the IC package substrate 610 supports a first IC die 10, a subsequent IC die 20, a third IC die 30 and a fourth IC die 40 according to an embodiment.

In an embodiment, a DS EMIB 620 is depicted below the die side 611 in ghosted lines. The dual-sided embedded multi-die interconnect bridge 620 is fabricated with a silicon section that includes power-delivery through-silicon metal tracks, and ground-return through-silicon metal tracks such as those depicted in FIGS. 1 and 3A.

Further, emanating from the DS EMIB 620 are one each of a power-delivery via (e.g. a subsequent power-delivery via 162' to the subsequent IC die 20), a ground-return via (e.g. a third ground-return via 164''' to the third IC die 30) and a signal via (e.g. a fourth signal via 164$^{iv}$ to the fourth IC die 40).

In an embodiment, each IC die 10, 20, 30 and 40, operates at a different potential. In an embodiment, the four IC dice operate among three different potentials. In an embodiment, the four IC dice operate among two different potentials. In an embodiment, all four IC dice operate as the same potential.

In an embodiment, the first and subsequent IC dice 10 and 20 are part of a chipset for a computing system. In an embodiment, the first IC die 10 is a logic processor such as is made by Intel Corporation of Santa Clara, Calif. In an embodiment, the subsequent IC die 20 is a non-volatile memory die stack including at least one through-silicon via between IC memory dice. In an embodiment, the third IC die 30 is a platform-controller hub IC die 30. In an embodiment, the fourth IC die 40 is a baseband processor die 40.

In an embodiment, two of the IC dice are a disaggregated processor.

To illustrate the dual-sided EMIB bridge-containing IC package IC package embodiments and methods disclosed herein, a non-limiting list of examples is provided herein: Example 1 is a silicon bridge, comprising: a silicon portion and a metallization portion, and an interface therebetween; the silicon portion including: a land side and edge boundaries at the land side; a land-side power-delivery through-silicon metal track passing through the land side, between the edge boundaries; a land-side ground-return through-silicon metal track passing through the land side, spaced apart from the land-side power-delivery via, and between the edge boundaries; the metallization portion forming the interface with the silicon portion, further including: a die side opposite the land side and edge boundaries at the die side; a die-side first power-delivery via passing through the die side at a first-die position; a die-side subsequent power-delivery via passing through the die side at a subsequent-die position; a first signal via passing through the die side at the first-die region; a subsequent signal via passing through the die side at the subsequent-die region; a power-delivery rail at the interface and contacting the first power-delivery through-silicon metal track; and a ground-return rail in the metallization portion and contacting the first ground-return through-silicon metal track.

In Example 2, the subject matter of Example 1 optionally includes a signal trace in the metallization portion, wherein the first and subsequent signal vias each contact the signal trace.

In Example 3, the subject matter of any one or more of Examples 1-2 optionally include wherein the silicon bridge is at least partially embedded in a cavity opening in an integrated-circuit (IC) package substrate, wherein the IC package substrate has a die side and a land side.

In Example 4, the subject matter of any one or more of Examples 1-3 optionally include wherein the silicon bridge is at least partially embedded in a cavity opening in an integrated-circuit package substrate, wherein the IC package substrate has a die side and a land side, further including: a signal trace in the metallization portion, and a first and a subsequent signal via, each signal via contacting the signal trace, and each signal via passing through the metallization die side and each signal via passing through the IC package die side.

In Example 5, the subject matter of any one or more of Examples 1-4 optionally include wherein the silicon bridge is at least partially embedded in a cavity opening in an integrated-circuit package substrate, wherein the IC package substrate has a die side and a land side, further including: a signal trace in the metallization portion, and a first and a subsequent signal via, each signal via contacting the signal trace, and each signal via passing through the metallization die side and each signal via passing through the IC package die side; a first integrated-circuit die on the IC package die side, wherein the first signal via is coupled to the first IC die; and a subsequent integrated-circuit die on the IC package die side, wherein the subsequent signal via is coupled to the subsequent IC die.

In Example 6, the subject matter of any one or more of Examples 1-5 optionally include wherein the land-side power-delivery through-silicon metal track is insulated from the silicon portion by a dielectric film in a power-delivery via through-silicon corridor.

In Example 7, the subject matter of any one or more of Examples 1-6 optionally include wherein the land-side ground-return through-silicon metal track via is insulated from the silicon portion by a dielectric film in a ground-return via through-silicon corridor.

In Example 8, the subject matter of any one or more of Examples 1-7 optionally include wherein the land-side power-delivery through-silicon metal track is insulated from the silicon portion by a dielectric film in a power-delivery via through-silicon corridor, and wherein the land-side ground-return through-silicon metal track is insulated from the silicon portion by a dielectric film in a ground-return via through-silicon corridor.

In Example 9, the subject matter of any one or more of Examples 1-8 optionally include wherein the land-side power-delivery through-silicon metal track is insulated from the silicon portion by a silicon nitride film in a power-delivery via through-silicon corridor, and wherein the land-side ground-return through-silicon metal track is insulated from the silicon portion by a silicon nitride film in a ground-return via through-silicon corridor.

In Example 10, the subject matter of any one or more of Examples 1-9 optionally include wherein the land-side power-delivery through-silicon metal track is insulated from the silicon portion by a silicon nitride film in a power-delivery via through-silicon corridor, and wherein the land-side ground-return through-silicon metal track is insulated from the silicon portion by a silicon nitride film in a ground-return via through-silicon corridor, further including: a third IC die; and a fourth IC die on the IC package substrate die side, wherein each of the third IC die and the fourth IC die are coupled to the DS EMIB by die-side power and ground-return through-silicon metal tracks, and by signal vias.

Example 11 is an integrated-circuit package, comprising: a dual-sided embedded multi-die interconnect bridge (DS EMIB), wherein the DS EMIB is at least partially embedded in an integrated-circuit package substrate, and wherein the DS EMIB includes: a silicon portion and a metallization portion, and an interface therebetween, the silicon portion including: a land side and edge boundaries at the land side; a land-side power-delivery through-silicon metal track passing through the land side, between the edge boundaries; a land-side ground-return through-silicon metal track passing through the land side, spaced apart from the land-side power-delivery through-silicon metal track, and between the edge boundaries; wherein the metallization portion forms the interface with the silicon portion, further includes: a die side opposite the land side and edge boundaries at the die side; a die-side first power-delivery via passing through the die side at a first-die position; a die-side subsequent power-delivery via passing through the die side at a subsequent-die position; a first signal via passing through the die side at the first-die region; a subsequent signal via passing through the die side at the subsequent-die region; a power-delivery rail at the interface and contacting the first power-delivery through-silicon metal track; and a ground-return rail in the metallization portion and contacting the first ground-return through-silicon metal track; wherein the integrated-circuit package substrate has a die side and a land side; a first IC die on the die side at the first-die position wherein the first IC die is coupled to the DS EMIB by the first die-side power-delivery via and by a ground-return via that each emanate from the DS EMIB; a subsequent IC die on the die side at the subsequent-die position, wherein the subsequent die is coupled to the DS EMIB by the subsequent power-delivery via and by a subsequent ground-return via, each that emanate from the DS EMIB; an IC package land side, wherein a power-delivery through-silicon metal track extends from near the IC package land side, through the DS EMIB through the silicon portion; and wherein a ground-return through-silicon metal track extends from near the IC package land side, through the DS EMIB through the silicon portion.

In Example 12, the subject matter of Example 11 optionally includes a third IC die and a fourth IC die on the IC package substrate die side, wherein each of the third IC die and the fourth IC die are coupled to the DS EMIB by die-side power-delivery and ground-return through-silicon metal tracks, and by signal vias.

In Example 13, the subject matter of any one or more of Examples 11-12 optionally include wherein the land-side power-delivery through-silicon metal track is insulated from the silicon portion by a dielectric film in a power-delivery via through-silicon corridor.

In Example 14, the subject matter of any one or more of Examples 11-13 optionally include wherein the land-side ground-return through-silicon metal track is insulated from the silicon portion by a dielectric film in a ground-return via through-silicon corridor.

In Example 15, the subject matter of any one or more of Examples 11-14 optionally include wherein the land-side power-delivery through-silicon metal track is insulated from the silicon portion by a dielectric film in a power-delivery via through-silicon corridor, and wherein the land-side ground-return through-silicon metal track is insulated from the silicon portion by a dielectric film in a ground-return via through-silicon corridor.

In Example 16, the subject matter of any one or more of Examples 11-15 optionally include wherein the land-side power-delivery through-silicon metal track is insulated from the silicon portion by a silicon nitride film in a power-delivery via through-silicon corridor, and wherein the land-side ground-return through-silicon metal track is insulated from the silicon portion by a silicon nitride film in a ground-return via through-silicon corridor.

In Example 17, the subject matter of any one or more of Examples 11-16 optionally include wherein the land-side power-delivery through-silicon metal track is insulated from the silicon portion by a silicon nitride film in a power-delivery via through-silicon corridor, and wherein the land-side ground-return through-silicon metal track is insulated from the silicon portion by a silicon nitride film in a ground-return via through-silicon corridor further including: a printed wiring board mated to the IC package substrate at the land side; and a chipset accommodated on the printed wiring board.

Example 18 is a method of assembling a dual-sided multi-die interconnect bridge, comprising: etching a power via corridor and a ground via corridor through a silicon substrate; forming a nitride film in the power via corridor and the ground via corridor; forming a power-delivery through-silicon metal track in the power via corridor and a ground-return through-silicon metal track the ground via corridor; forming a metallization portion to couple to the power-delivery through-silicon metal track and the ground-return through-silicon metal track, to form a dual-sided multi-die interconnect bridge (DS MIB); at least partially embedding the DS MIB in an integrated-circuit package substrate, to achieve a dual-sided embedded multi-die interconnect bridge (DS EMIB); coupling a first die on the IC package substrate at a die side, to the DS EMIB; and coupling a subsequent die on the IC package substrate die side to the DS EMIB.

In Example 19, the subject matter of Example 18 optionally includes coupling power and ground, ground and signal vias to each of the first and subsequent IC dice.

In Example 20, the subject matter of any one or more of Examples 18-19 optionally include coupling power and ground to each of the first and subsequent IC dice by respective power-delivery and ground-return through-silicon metal tracks, wherein coupling the first IC die is configured for a first potential operative of the first IC die, and coupling the subsequent IC die is configured for a subsequent potential operative of the subsequent IC die, and wherein the first potential is different from the subsequent potential.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electrical device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the disclosed embodiments should be determined with reference to the appended claims, along with the full scope of equivalents to which such claims are entitled.

The invention claimed is:

1. A silicon bridge, comprising:
a silicon portion and a metallization portion, and an interface therebetween;
the silicon portion including:
a land side and edge boundaries at the land side;
a land-side power-delivery through-silicon metal track passing through the land side, between the edge boundaries;
a land-side ground-return through-silicon metal track passing through the land side, spaced apart from the land-side power-delivery through-silicon metal track, and between the edge boundaries;
the metallization portion forming the interface with the silicon portion, further including:
a die side opposite the land side and edge boundaries at the die side;
a die-side first power-delivery via passing through the die side at a first-die region;
a die-side subsequent power-delivery via passing through the die side at a subsequent-die region;
a first signal via passing through the die side at the first-die region;
a subsequent signal via passing through the die side at the subsequent-die region;
a power-delivery plane at the interface and contacting the land-side power-delivery through-silicon metal track; and
a ground-return plane in the metallization portion and contacting the land-side ground-return through-silicon metal track.

2. The silicon bridge of claim 1, further including a signal trace in the metallization portion, wherein the first and subsequent signal vias each contact the signal trace.

3. The silicon bridge of claim 1, wherein the silicon bridge is at least partially embedded in a cavity opening in an integrated-circuit (IC) package substrate, wherein the IC package substrate has a die side and a land side.

4. The silicon bridge of claim 1, wherein the silicon bridge is at least partially embedded in a cavity opening in an integrated-circuit package substrate, wherein the IC package substrate has a die side and a land side, further including:
a signal trace in the metallization portion, and a first and a subsequent signal via, each signal via contacting the signal trace, and each signal via passing through the metallization die side and each signal via passing through the IC package die side.

5. The silicon bridge of claim 1, wherein the silicon bridge is at least partially embedded in a cavity opening in an integrated-circuit package substrate, wherein the IC package substrate has a die side and a land side, further including:
   a signal trace in the metallization portion, and a first and a subsequent signal via, each signal via contacting the signal trace, and each signal via passing through the metallization die side and each signal via passing through the IC package die side;
   a first integrated-circuit die on the IC package die side, wherein the first signal via is coupled to the first IC die; and
   a subsequent integrated-circuit die on the IC package die side, wherein the subsequent signal via is coupled to the subsequent IC die.

6. The silicon bridge of claim 5, wherein the land-side power-delivery through-silicon metal track is insulated from the silicon portion by a silicon nitride film in a power-delivery via through-silicon corridor, and wherein the land-side ground-return through-silicon metal track is insulated from the silicon portion by a silicon nitride film in a ground-return via through-silicon corridor, further including:
   a third IC die; and
   a fourth IC die on the IC package substrate die side, wherein each of the third IC die and the fourth IC die are coupled to the silicon bridge by die-side power and ground-return through-silicon metal tracks, and by signal vias.

7. The silicon bridge of claim 1, wherein the land-side power-delivery through-silicon metal track is insulated from the silicon portion by a dielectric film in a power-delivery via through-silicon corridor.

8. The silicon bridge of claim 1, wherein the land-side ground-return through-silicon metal track via is insulated from the silicon portion by a dielectric film in a ground-return via through-silicon corridor.

9. The silicon bridge of claim 1, wherein the land-side power-delivery through-silicon metal track is insulated from the silicon portion by a dielectric film in a power-delivery via through-silicon corridor, and wherein the land-side ground-return through-silicon metal track is insulated from the silicon portion by a dielectric film in a ground-return via through-silicon corridor.

10. The silicon bridge of claim 1, wherein the land-side power-delivery through-silicon metal track is insulated from the silicon portion by a silicon nitride film in a power-delivery via through-silicon corridor, and wherein the land-side ground-return through-silicon metal track is insulated from the silicon portion by a silicon nitride film in a ground-return via through-silicon corridor.

11. An integrated-circuit package, comprising:
   a dual-sided embedded multi-die interconnect bridge (DS EMIB), wherein the DS EMIB is at least partially embedded in an integrated-circuit package substrate, and wherein the DS EMIB includes:
   a silicon portion and a metallization portion, and an interface therebetween, the silicon portion including:
   a land side and edge boundaries at the land side;
   a land-side power-delivery through-silicon metal track passing through the land side, between the edge boundaries;
   a land-side ground-return through-silicon metal track passing through the land side, spaced apart from the land-side power-delivery through-silicon metal track, and between the edge boundaries;
   wherein the metallization portion forms the interface with the silicon portion, further includes:
   a die side opposite the land side and edge boundaries at the die side;
   a die-side first power-delivery via passing through the die side at a first-die region;
   a die-side subsequent power-delivery via passing through the die side at a subsequent-die region;
   a first signal via passing through the die side at the first-die region;
   a subsequent signal via passing through the die side at the subsequent-die region;
   a power-delivery plane at the interface and contacting the land-side power-delivery through-silicon metal track; and
   a ground-return plane in the metallization portion and contacting the land-side ground-return through-silicon metal track;
   wherein the integrated-circuit package substrate has a die side and a land side;
   a first IC die on the die side at the first-die region wherein the first IC die is coupled to the DS EMIB by the first die-side power-delivery via and by a ground-return via that each emanate from the DS EMIB;
   a subsequent IC die on the die side at the subsequent-die region, wherein the subsequent die is coupled to the DS EMIB by the subsequent power-delivery via and by a subsequent ground-return via, each that emanate from the DS EMIB;
   an IC package land side, wherein the power-delivery through-silicon metal track extends from near the IC package land side, through the silicon portion; and
   wherein the ground-return through-silicon metal track extends from near the IC package land side, through the silicon portion.

12. The integrated-circuit package of claim 11, further including a third IC die and a fourth IC die on the IC package substrate die side, wherein each of the third IC die and the fourth IC die are coupled to the DS EMIB by die-side power-delivery and ground-return through-silicon metal tracks, and by signal vias.

13. The integrated-circuit package of claim 11, wherein the land-side power-delivery through-silicon metal track is insulated from the silicon portion by a dielectric film in a power-delivery via through-silicon corridor.

14. The integrated-circuit package of claim 11, wherein the land-side ground-return through-silicon metal track is insulated from the silicon portion by a dielectric film in a ground-return via through-silicon corridor.

15. The integrated-circuit package of claim 11, wherein the land-side power-delivery through-silicon metal track is insulated from the silicon portion by a dielectric film in a power-delivery via through-silicon corridor, and wherein the land-side ground-return through-silicon metal track is insulated from the silicon portion by a dielectric film in a ground-return via through-silicon corridor.

16. The integrated-circuit package of claim 11, wherein the land-side power-delivery through-silicon metal track is insulated from the silicon portion by a silicon nitride film in a power-delivery via through-silicon corridor, and wherein the land-side ground-return through-silicon metal track is insulated from the silicon portion by a silicon nitride film in a ground-return via through-silicon corridor.

17. The integrated-circuit package of claim 11, wherein the land-side power-delivery through-silicon metal track is insulated from the silicon portion by a silicon nitride film in a power-delivery via through-silicon corridor, and wherein the land-side ground-return through-silicon metal track is insulated from the silicon portion by a silicon nitride film in a ground-return via through-silicon corridor further including:
  a printed wiring board mated to the IC package substrate at the land side; and
  a chipset accommodated on the printed wiring board.

* * * * *